Figure 1:
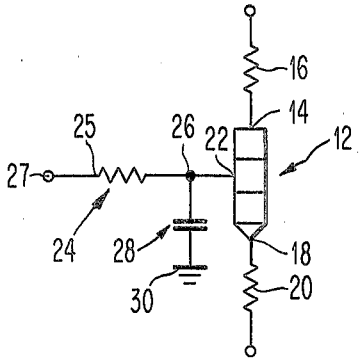
Figure 2:
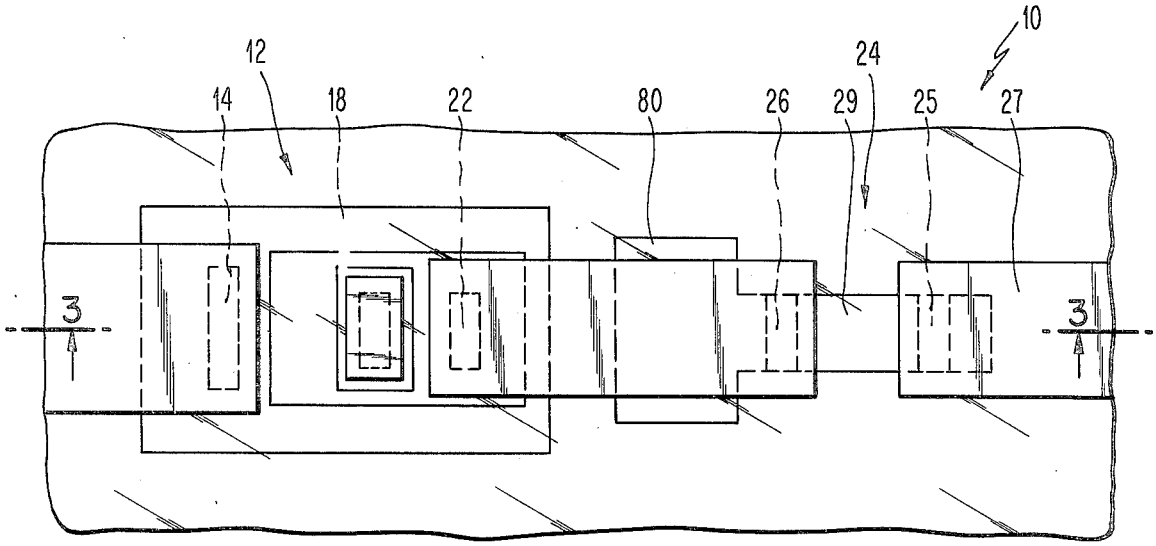
Figure 3:
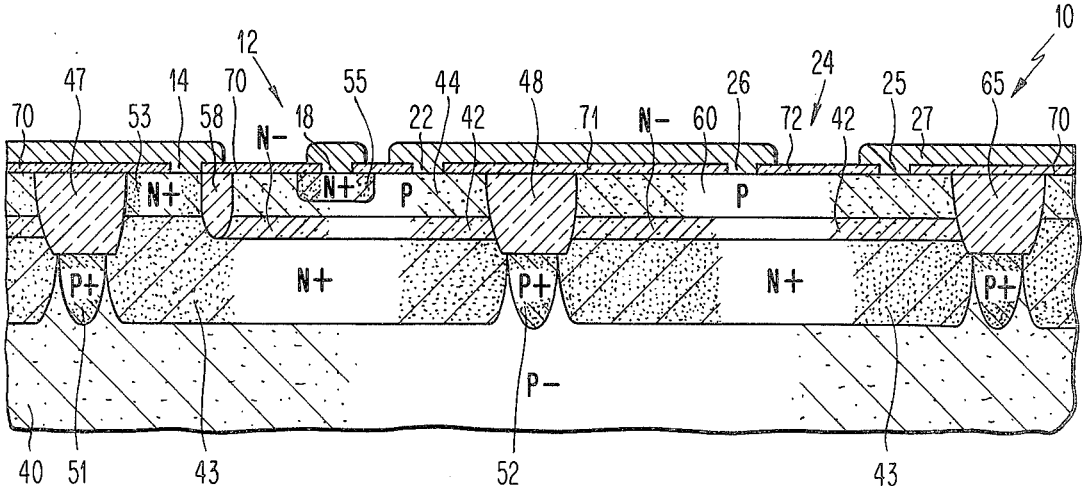

United States Defensive Publication [19] (H) [11] T983,011

Giuliani et al. [43] Jun. 5, 1979

[54] ARRANGEMENT FOR STABILIZING A BIPOLAR SEMICONDUCTOR DEVICE UTILIZED IN EMITTER FOLLOWER OR CURRENT SWITCHING CONFIGURATION

[75] Inventors: Sylvester W. Giuliani; Arnold P. Mercer, both of Wappingers Falls, N.Y.

[73] Assignee: International Business Machines, Armonk, N.Y.

[21] Appl. No.: 710,351

[22] Filed: Jul. 30, 1976

Related U.S. Application Data

[63] Continuation of Ser. No. 558,590, Mar. 14, 1975, abandoned.

[51] Int. Cl.[2] ..... H01L 27/02; H01L 27/04; H01L 27/12; H03F 3/04

[52] U.S. Cl. ..... 357/51; 357/14; 357/50; 330/302; 330/309; 357/89

[57] ABSTRACT

An arrangement for stabilizing a bipolar semiconductor device such as might be commonly used in emitter follower or current switching configuration by the addition of lumped capacitance between the base of the semiconductor device and ground. In one preferred embodiment the lumped capacitance is derived from a flared or enlarged end of a base stabilizing resistor connected to the base of the semiconductor device, and in an alternative embodiment the capacitance is derived from a base collector junction of another unconnected semiconductor device located upon a common substrate with the semiconductor to be stabilized. The effect of the lumped capacitance, when added to the circuit, is to move the $Z_{in}$ plot of the transistor toward the fourth quadrant of a Nyquist diagram without the addition of a large series base resistance. The addition of the lumped capacitance is preferably utilized in conjunction with a small base stabilizing resistor in order to achieve stability in the input of the semiconductor.

6 Claims, 1 Sheet Drawing,

15 Pages Specification

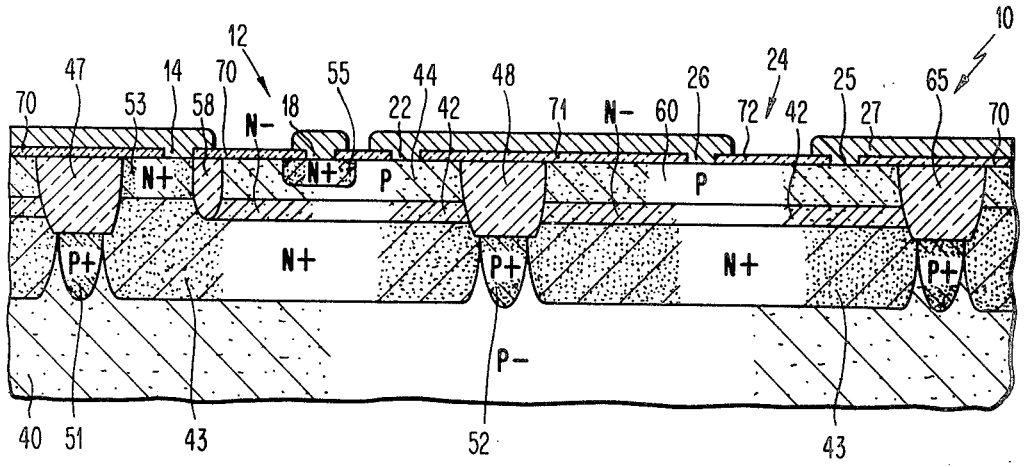

The file of this unexamined application may be inspected and copies thereof may be purchased (849 O.G. 1221, Apr. 9, 1968).